United States Patent
Yoon et al.

(10) Patent No.: US 8,722,474 B2
(45) Date of Patent: May 13, 2014

(54) SEMICONDUCTOR DEVICE INCLUDING STEPPED GATE ELECTRODE AND FABRICATION METHOD THEREOF

(75) Inventors: Hyung Sup Yoon, Daejeon (KR); Byoung-Gue Min, Daejeon (KR); Jong Min Lee, Daejeon (KR); Seong-Il Kim, Daejeon (KR); Dong Min Kang, Daejeon (KR); Ho Kyun Ahn, Daejeon (KR); Jong-Won Lim, Daejeon (KR); Jae Kyoung Mun, Daejeon (KR); Eun Soo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/592,589

(22) Filed: Aug. 23, 2012

(65) Prior Publication Data

US 2013/0146944 A1 Jun. 13, 2013

(30) Foreign Application Priority Data

Dec. 13, 2011 (KR) ........................ 10-2011-0133715

(51) Int. Cl.
 *H01L 21/338* (2006.01)
(52) U.S. Cl.
 USPC ........... 438/167; 438/172; 438/176; 438/182; 257/192; 257/194
(58) Field of Classification Search
 USPC ......... 438/167, 172, 176, 182, 575, 576, 579; 257/192, 194, E21.451, E29.317
 See application file for complete search history.

(56) References Cited

U.S. PATENT DOCUMENTS

| 7,709,269 B2 * | 5/2010 | Smith et al. .......... 436/182 |
| 2006/0054925 A1 * | 3/2006 | Kikkawa .......... 257/192 |

FOREIGN PATENT DOCUMENTS

| JP | 63-015475 A | 1/1988 |
| JP | 63-193570 A | 8/1988 |
| JP | 2010-251540 A | 11/2010 |
| KR | 10-2000-0039191 A | 7/2000 |

OTHER PUBLICATIONS

I. Hanyu et al., "Super Low-Noise HEMTs with a T-Shaped WSi$_x$ Gate", Electronics Letters, Oct. 13, 1988, pp. 1327-1328, vol. 24, No. 21.
Chia-Ta Chang et al., "30-GHz Low-Noise Performance of 100-nm-Gate-Recessed n-GaN/AlGaN/GaN HEMTs", IEEE Electron Device Letters, Feb. 2010, pp. 105-107, vol. 31, No. 2.

* cited by examiner

*Primary Examiner* — Theresa T Doan
(74) *Attorney, Agent, or Firm* — Rabin & Berdo, P.C.

(57) ABSTRACT

Disclosed are a semiconductor device including a stepped gate electrode and a method of fabricating the semiconductor device. The semiconductor device according to an exemplary embodiment of the present disclosure includes: a semiconductor substrate having a structure including a plurality of epitaxial layers and including an under-cut region formed in a part of a Schottky layer in an upper most part thereof; a cap layer, a first nitride layer and a second nitride layer sequentially formed on the semiconductor substrate to form a stepped gate insulating layer pattern; and a stepped gate electrode formed by depositing a heat-resistant metal through the gate insulating layer pattern, wherein the under-cut region includes an air-cavity formed between the gate electrode and the Schottky layer.

7 Claims, 6 Drawing Sheets

SEMICONDUCTOR DEVICE INCLUDING STEPPED GATE ELECTRODE AND FABRICATION METHOD THEREOF

CROSS-REFERENCE TO RELATED APPLICATIONS

This application is based on and claims priority from Korean Patent Application No. 10-2011-0133715, filed on Dec. 13, 2011, with the Korean Intellectual Property Office, the disclosure of which is incorporated herein in its entirety by reference.

TECHNICAL FIELD

The present disclosure relates to a field effect high frequency semiconductor device, and to a semiconductor device including a stepped gate electrode and a method of fabricating the semiconductor device.

BACKGROUND

FIGS. 1A to 1D are diagrams illustrating a method of fabricating a field effect high frequency semiconductor device, such as a high electron mobility transistor (HEMT) or a metal-semiconductor field effect transistor (MESFET), in the related art.

First, as illustrated in FIG. 1A, an active region is defined by dry etching a semiconductor substrate having a structure in which an SiC substrate 101, an AlN buffer layer 103, a non-doped GaN channel layer 105, a non-doped AlGaN spacer layer 107 and a non-doped AlGaN Schottky layer 109 are stacked.

Subsequently, as illustrated in FIG. 1B, an ohmic metal electrode 111 is formed, PMMA and co-polymer resist are applied, and then an exposure is performed through an electron beam lithography method, to form a T-shaped resist pattern 113.

Next, as illustrated in FIG. 1C, a gate metal 115 formed of Ni/Au is deposited using vacuum deposition equipment, and when the resist pattern 113 is removed through a lift-off process, a T-shaped gate electrode 117 illustrated in FIG. 1D is completed.

However, in the semiconductor device fabricated through the aforementioned method in the related art, the T-shaped resist pattern is formed using the PMMA and the co-polymer. Accordingly, when a T-shaped gate electrode having a fine gate length is formed, there is a problem in that gate metal is not uniformly deposited in a vicinity of a narrow opening of the gate pattern. When the gate metal is thickly deposited in order to reduce resistance of the gate electrode, a temperature of the vacuum deposition equipment rises such that the resist pattern becomes deformed, thereby failing to stably form the T-shaped gate electrode.

When a high-frequency semiconductor device is fabricated using the existing T-shaped gate electrode, a high electric field is generated between the gate electrode and the drain electrode, so that breakdown voltage of the semiconductor device is decreased and the reliability of the device is deteriorated.

SUMMARY

The present disclosure has been made in an effort to provide a method of stably fabricating a high frequency semiconductor device including a gate electrode having a fine length.

The present disclosure also has been made in an effort to provide a high frequency semiconductor device having a small resistance value, capable of releasing an electric field between a gate electrode and a drain electrode, and having high breakdown voltage by forming a stepped gate electrode, and a method of fabricating the high frequency semiconductor device.

An exemplary embodiment of the present disclosure provides a method of fabricating a semiconductor device, including: forming a cap layer on a semiconductor substrate having a structure including multiple epitaxial layers and etching a part of the cap layer, to form an active region; sequentially forming a first nitride layer, a second nitride layer and a resist pattern for forming a gate on the active region and the cap layer; sequentially etching the second nitride layer and the first nitride layer through the resist pattern and removing the resist pattern, to form a stepped gate insulating layer pattern; forming a gate head pattern on the second nitride layer; etching a part of a Schottky layer in an upper most part of the semiconductor substrate through the gate insulating layer pattern, to form an under-cut region; depositing a heat-resistant metal through the gate insulating layer pattern and the gate head pattern, to form a stepped gate electrode; and removing the gate head pattern and depositing an insulating layer.

The under-cut region may include an air-cavity formed between the gate electrode and the Schottky layer.

The method of fabricating the semiconductor device may further include forming an ohmic electrode by depositing at least one metal among Ti, Al, Ni, Pd and Au on both side surfaces of the cap layer before the forming of the second nitride layer.

Another exemplary embodiment of the present disclosure provides a semiconductor device including: a semiconductor substrate having a structure including a plurality of epitaxial layers and including an under-cut region formed in a part of a Schottky layer in an upper most part thereof; a cap layer, a first nitride layer and a second nitride layer sequentially formed on the semiconductor substrate to form a stepped gate insulating layer pattern; and a stepped gate electrode formed by depositing a heat-resistant metal through the gate insulating layer pattern, in which the under-cut region includes an air-cavity formed between the gate electrode and the Schottky layer.

According to the exemplary embodiments of the present disclosure, a high frequency semiconductor device including a fine stepped gate electrode may be stably fabricated by using a photo resist and two-layered nitride layers having different etch rates may be stably fabricated.

A semiconductor device having low gate resistance and high breakdown voltage may be fabricated by forming a stepped gate electrode and an air cavity in a contact portion between the gate electrode and the Schottky layer.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1A:
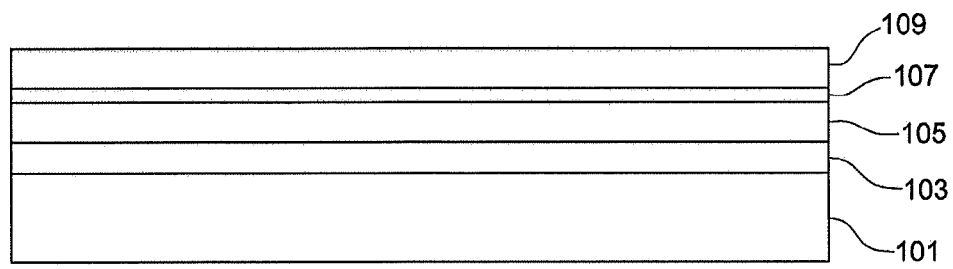
FIGS. 1A to 1D are diagrams illustrating a method of fabricating a field effect high frequency semiconductor device in the related art.
Figure 1B:
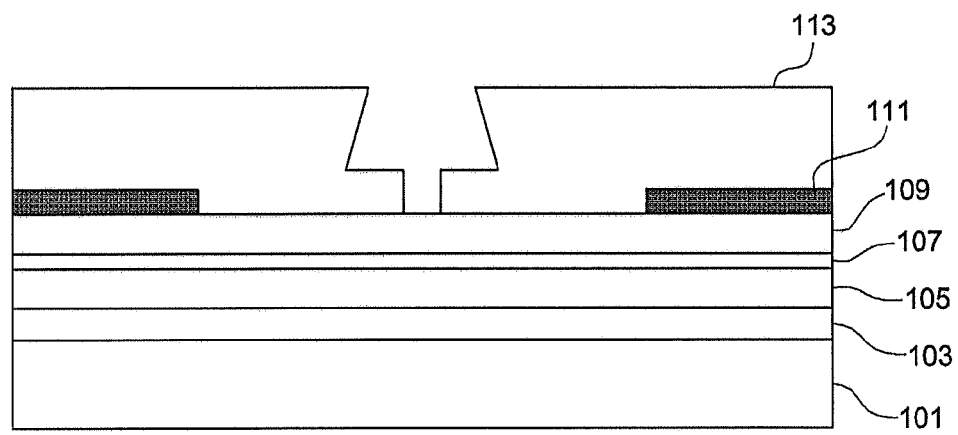
Figure 1C:
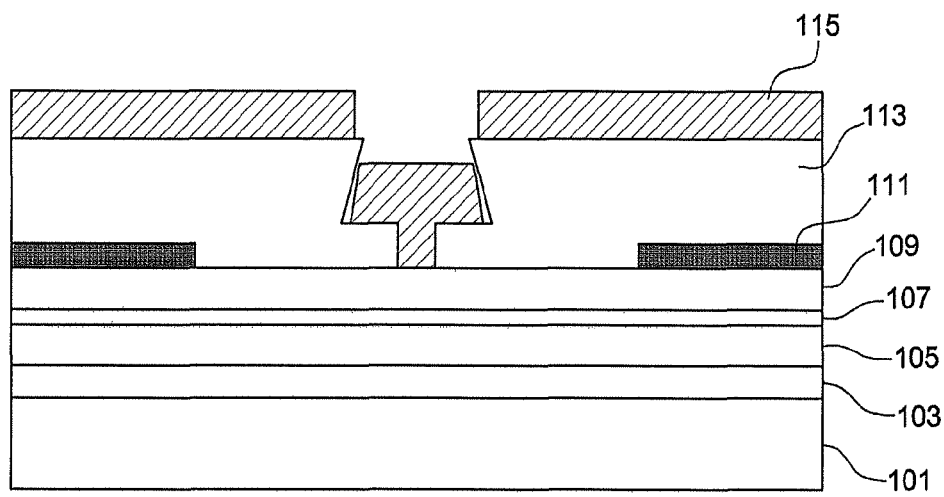
Figure 1D:
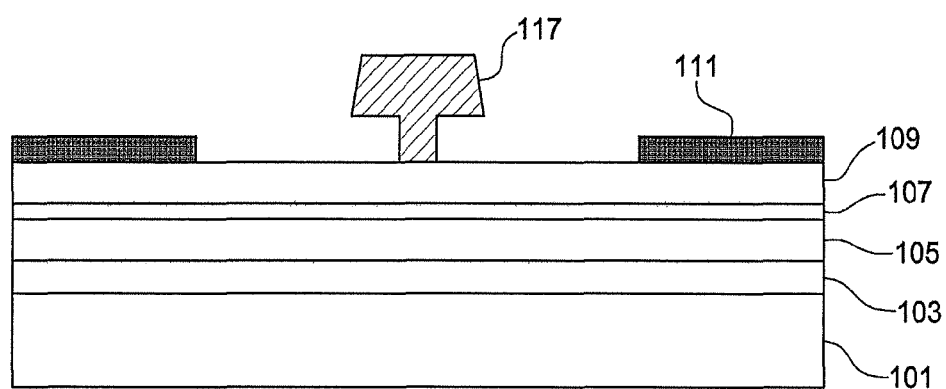

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

FIGS. 2A to 2H are diagrams illustrating a method of fabricating a semiconductor device including a stepped gate electrode according to an exemplary embodiment of the present disclosure.

Referring to FIGS. 2A to 2H, a method of fabricating a semiconductor device according to an exemplary embodiment of the present disclosure includes forming a cap layer 211 on a semiconductor substrate 200 having a structure including multiple epitaxial layers and etching a part of the cap layer 211, to form an active region 210, sequentially forming a first nitride layer 215, a second nitride layer 217, and a resist pattern 219 for forming a gate on the active region 210 and the cap layer 211, sequentially etching the second nitride layer 217 and the first nitride layer 215 through the resist pattern 219 and removing the resist pattern 219, to form a stepped gate insulating layer pattern 220, forming a gate head pattern 221 on the second nitride layer 217, etching a part of a Schottky layer 209 in an upper most part of the semiconductor substrate 200 through the gate insulating layer pattern 220, to form an under-cut region 230, depositing a heat-resistant metal through the gate insulating layer pattern 220 and the gate head pattern 221, to form a stepped gate electrode 223, and removing the gate head pattern 221 and depositing an insulating layer 227.

Figure 2A:
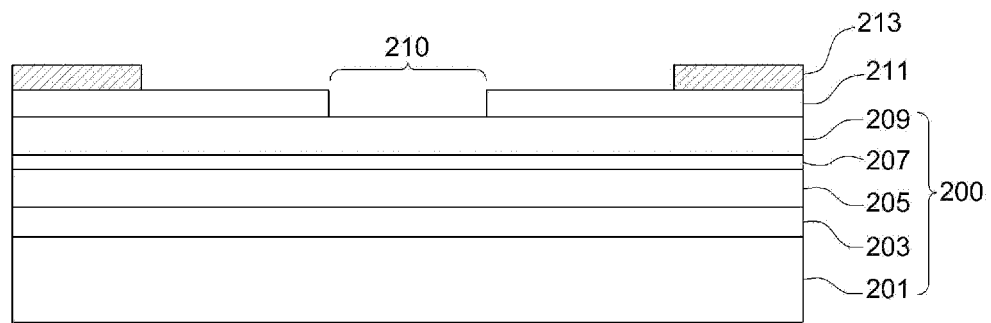
FIGS. 2A to 2H are diagrams illustrating a method of fabricating a semiconductor device including a stepped gate electrode according to an exemplary embodiment of the present disclosure.

Specifically, as illustrated in FIG. 2A, the non-doped GaN cap layer 211 is first formed on the semiconductor substrate 200 having in the structure including the multiple epitaxial layers, and the cap layer 211 is dry etched using a photo resist pattern, to form the active region 210. Here, the semiconductor substrate 200 may be formed to have a structure including an SiC substrate 201, an AlN buffer layer 203, a non-doped GaN channel layer 205, a non-doped AlGaN spacer layer 207 and a non-doped AlGaN Schottky layer 209. In this case, an ohmic electrode 213 may be formed by depositing at least one metal among Ti, Al, Ni, Pd and Au on both side surfaces of the cap layer 211 by using a vacuum deposition device, followed by performing a heat treatment at 830° C. The ohmic electrode 213 may function as a drain electrode and a source electrode.

Figure 2B:
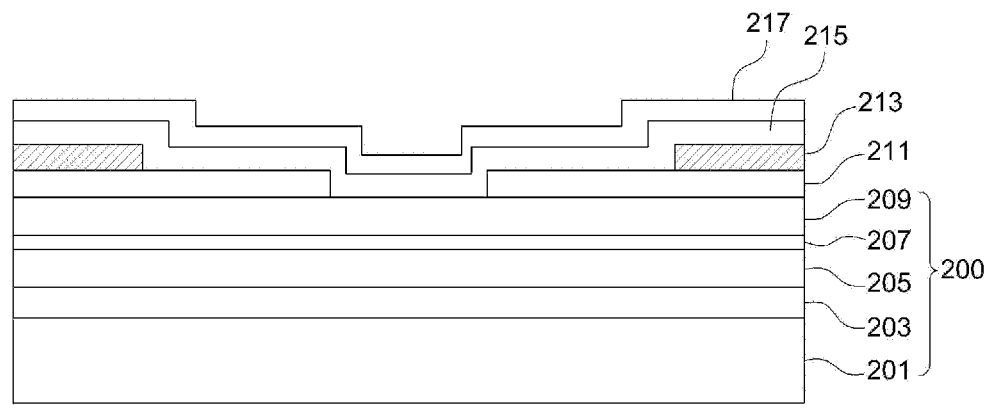

Subsequently, as illustrated in FIG. 2B, the first nitride layer 215 and the second nitride layer 217 for forming the stepped gate electrode are formed on the active region 210 and the cap layer 211. In this case, a plasma enhanced chemical vapor deposition (PECVD) process may be used. The first nitride layer 215 may be deposited in a thickness of 1500 Å at a high temperature in a range of 320° C. to 350° C., and the second nitride layer 217 may be deposited in a thickness of 1500 Å at a low temperature of 100° C.

Figure 2C:
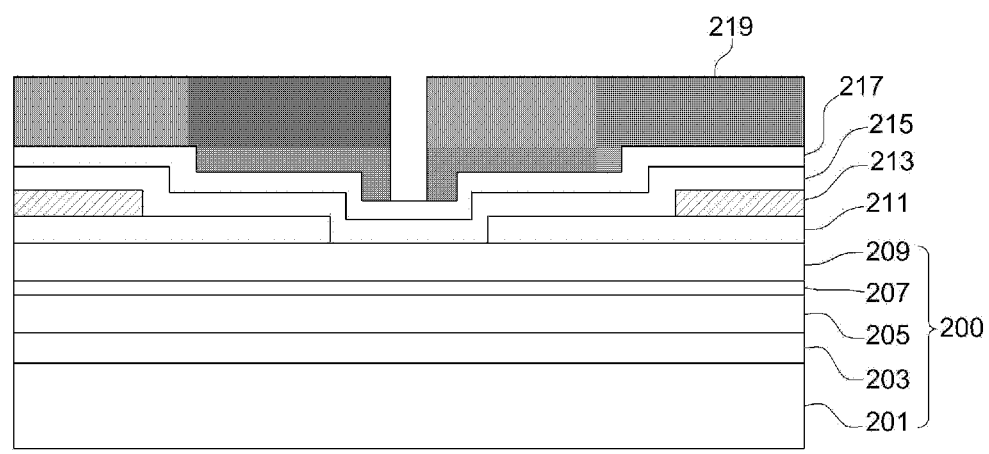

Next, as illustrated in FIG. 2C, the resist pattern 219 for defining a fine gate region is formed through the photo lithography method.

Figure 2D:
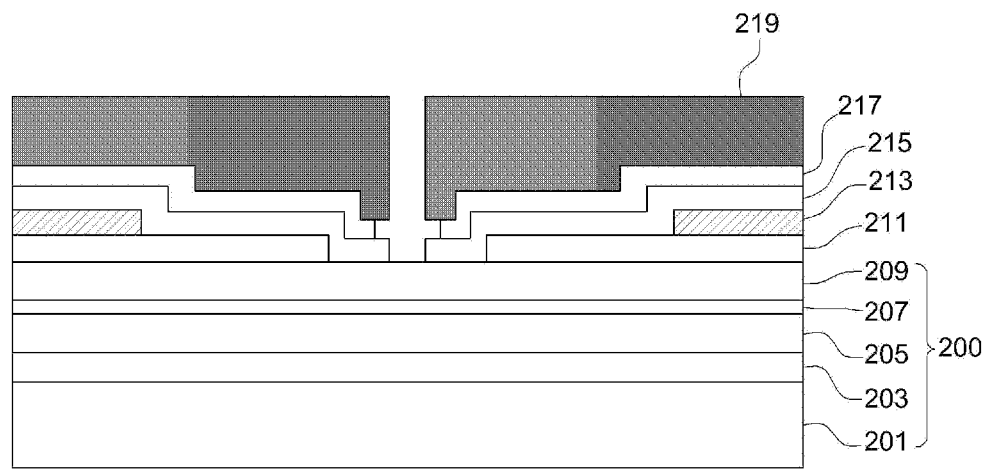
Figure 2E:
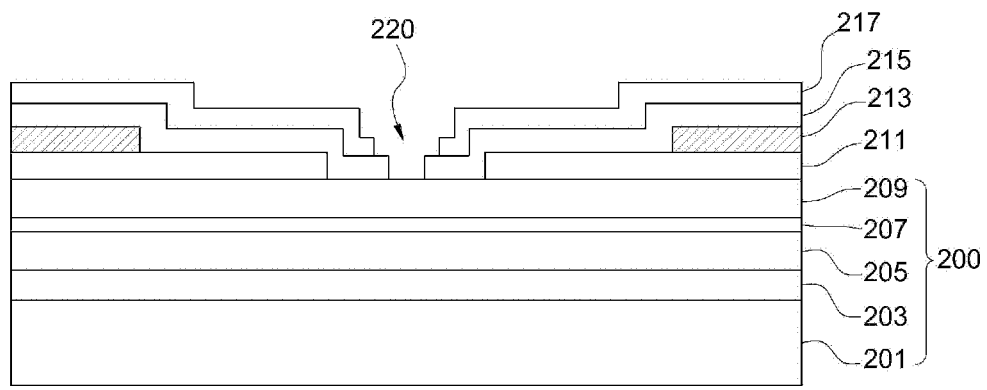

Subsequently, as illustrated in FIGS. 2D and 2E, the second nitride layer 217 and the first nitride layer 215 are sequentially dry etched through the resist pattern 219 and the resist pattern 219 is removed, to form the gate insulating layer pattern 220 having a stepped opening. In this case, the step-shaped pattern 220 in which the opening of the second nitride layer 217 is wider than that of the first nitride layer 215 due to a difference between etch rates of the first nitride layer 215 and the second nitride layer 217 is formed.

Figure 2F:
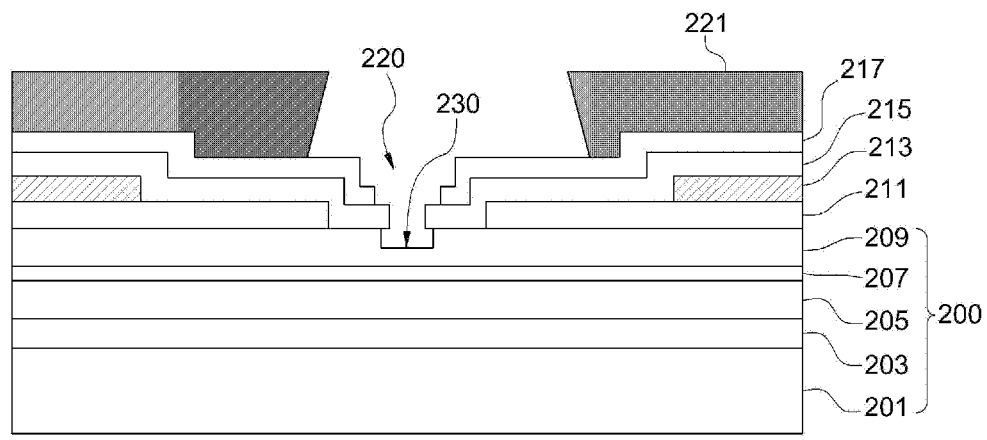

Next, as illustrated in FIG. 2F, the gate head pattern 221 is formed through the photo lithography method, and a part of the Schottky layer 209 is etched by an inductive coupled plasma (ICP) dry etching device using SF6, to form the under-cut region 230.

Figure 2G:
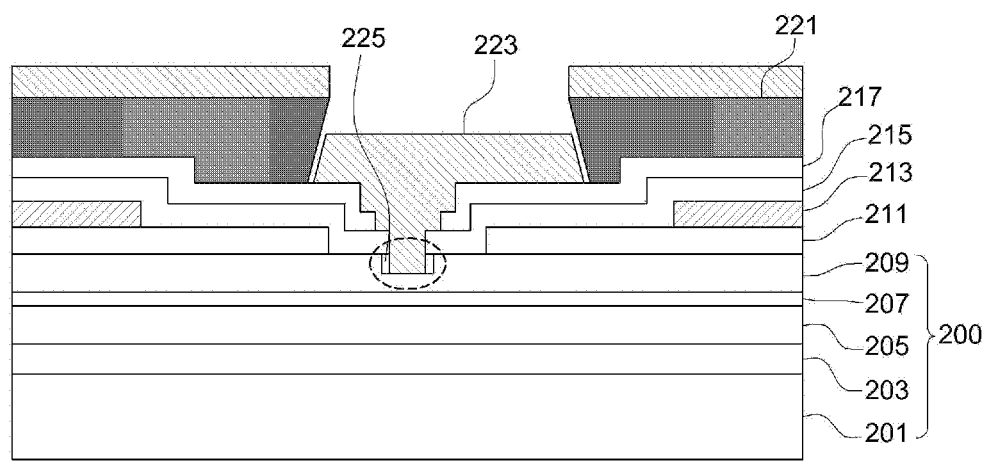

Then, as illustrated in FIG. 2G, the gate electrode 223 is formed by depositing at least one heat-resistant metal among WNx, WSix, W and Mo by using a sputtering vapor deposition method. Here, an air cavity 225 is formed between the Schottky layer 209 and the gate electrode 223 in the under-cut region 230.

Figure 2H:
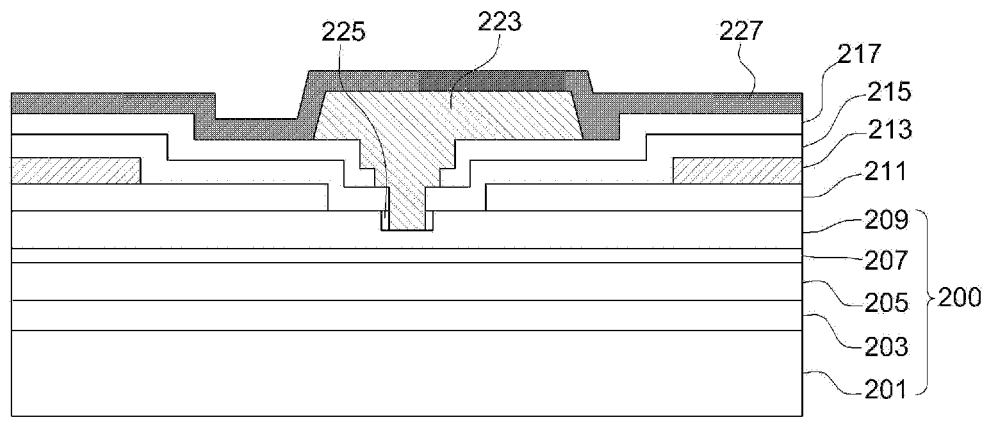

Subsequently, as illustrated in FIG. 2H, the gate head pattern 221 is removed by a lift-off method, and the insulating layer 227 for protecting the semiconductor device is deposited, so that the fabrication of the high frequency semiconductor device is completed.

As described above, the fine stepped gate electrode 223 may be stably formed using the photo resist and the two-layered nitride layers 215 and 217 having different etch rates, and the air cavity 225 may be formed in a contact portion of the Schottky layer 209 through an additional etching process. The semiconductor device fabricated according to the present disclosure has low gate resistance, and an electric field generated between the gate electrode and the drain electrode may be released, thereby achieving high breakdown voltage.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of fabricating a semiconductor device, comprising:
   forming a cap layer on a semiconductor substrate having a structure including a plurality of epitaxial layers and etching a part of the cap layer, to form an active region;
   sequentially forming a first nitride layer, a second nitride layer and a resist pattern for forming a gate on the active region and the cap layer;
   sequentially etching the second nitride layer and the first nitride layer through the resist pattern and removing the resist pattern, to form a stepped gate insulating layer pattern;
   forming a gate head pattern on the second nitride layer;
   etching a part of a Schottky layer in an upper most part of the semiconductor substrate through the gate insulating layer pattern, to form an under-cut region;
   depositing a heat-resistant metal through the gate insulating layer pattern and the gate head pattern, to form a stepped gate electrode; and
   removing the gate head pattern and depositing an insulating layer.

2. The method of claim 1, wherein the under-cut region includes an air-cavity formed between the gate electrode and the Schottky layer.

3. The method of claim 1, wherein the semiconductor substrate has a structure in which an SiC substrate, an AlN buffer layer, a GaN channel layer, an AlGaN spacer layer and an AlGaN Schottky layer are stacked.

4. The method of claim 1, wherein the first nitride layer is deposited in a thickness of 1500 Å at a temperature in a range of 320° C. to 350° C. through a plasma enhanced chemical vapor deposition (PECVD) process.

5. The method of claim 1, wherein the second nitride layer is deposited in a thickness of 1500 Å at a temperature of 100° C. through a PECVD process.

6. The method of claim 1, wherein the gate electrode is formed by depositing at least one heat-resistant metal among WNx, WSix, W and Mo by a sputtering method.

7. The method of claim 1, further comprising:
depositing at least one metal among Ti, Al, Ni, Pd and Au on both side surfaces of the cap layer to form an ohmic electrode, before the forming of the second nitride layer.

* * * * *